United States Patent
Chae et al.

(10) Patent No.: US 7,178,085 B2
(45) Date of Patent: Feb. 13, 2007

(54) ENCODER USING LOW DENSITY PARITY CHECK CODES AND ENCODING METHOD THEREOF

(75) Inventors: Su-Chang Chae, Daejeon (KR); Yong-Su Lee, Daejeon (KR); Jung-Pil Choi, Gunsan (KR); Youn-Ok Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 10/535,925

(22) PCT Filed: Nov. 21, 2003

(86) PCT No.: PCT/KR03/02532

§ 371 (c)(1),
(2), (4) Date: Sep. 28, 2005

(87) PCT Pub. No.: WO2004/047019

PCT Pub. Date: Jun. 3, 2004

(65) Prior Publication Data

US 2006/0053359 A1    Mar. 9, 2006

(30) Foreign Application Priority Data

Nov. 21, 2002    (KR) .................. 10-2002-0072642

(51) Int. Cl.
*H03M 13/00* (2006.01)
(52) U.S. Cl. ...................... 714/758; 714/801
(58) Field of Classification Search ............... 714/777, 714/801, 796, 794, 758, 800; 375/298
See application file for complete search history.

(56) References Cited

FOREIGN PATENT DOCUMENTS

| WO | WO2001 097387 | 12/2001 |
|---|---|---|
| WO | WO2002 091592 | 11/2002 |
| WO | WO2004 047019 | 6/2004 |

OTHER PUBLICATIONS

Ping et al. ('Low density parity check codes with semi-random parity check matrix,' IEEE, Jan. 1999).*
Alkafaji et al. (Numerical Methogs in Engineering Practice, 1986, pp. 138-157).*
'Efficient Encoding of Low-Density Parity-Check Codes' Richardson et al., IEEE Transactions on Information Theory, vol. 47, No. 2, Feb. 2001, pp. 638-640.

* cited by examiner

*Primary Examiner*—Guy J. Lamarre
(74) *Attorney, Agent, or Firm*—Ladas & Parry LLP

(57) ABSTRACT

An encoder using LDPC (low density parity check) codes, and an encoding method. The encoder comprises a parity check matrix generator for generating a parity check matrix H; and a codeword generator for processing the parity check matrix H to generate a codeword, and the codeword generator comprises: an AB analyzer for analyzing the parity check matrix H into matrixes A and B; a pivoting unit for pivoting the parity check matrix H; a bit-reversing unit for bit-reversing the pivoted matrix; an LU analyzer for analyzing the matrix A into matrixes L and U; and a codeword generator unit for performing a logical operation on the matrixes A, B, L and U. A bit-reversing method is used to effectively generate a parity check matrix having a high girth by using a regular encoder.

13 Claims, 4 Drawing Sheets

ENCODER USING LOW DENSITY PARITY CHECK CODES AND ENCODING METHOD THEREOF

CROSS REFERENCE TO RELATED APPLICATION

This application claims priority to and the benefit of Korea Patent Application No. 2002-72642 filed on Nov. 21, 2002 in the Korean Intellectual Property Office, the content of which is incorporated herein by reference.

BACKGROUND OF THE INVENTION (a) Field of the Invention

The present invention relates to an encoder and an encoding method in a mobile communication system. More specifically, the present invention relates to an encoder using LDPC (low density parity check) codes and an encoding method thereof.

(b) Description of the Related Art

It is required for the next-generation multimedia mobile communication aggressively studied recently to provide an international roaming service that allows calling anytime, anywhere, and by anyone by integrating various systems including a personal mobile phone, a wireless paging function, mobile data, and satellite communication, and to provide integrated multiple information services such as for speech, data, and images.

Since high-speed transmission and various data rates are needed so as to support multimedia communication services in mobile communication, it is essential to increase system efficiencies by using different encoding schemes according to categories of channels and data.

LDPC codes have recently been proposed for a channel coding method of the $4^{th}$-generation mobile communication system. The LDPC codes outperform the conventional turbo codes, have a less complex decoder, and allow parallel operations to thus enable high-speed processing, and since they also use an iterative decoding method in the same manner of a turbo decoder, they are appropriate for a mobile communication system which requires low error rates and high-speed data processing performance.

In the LDPC codes, components of the H matrix corresponding to the parity check matrix include a case of binary elements and another case of non-binary elements.

The H matrix configured with non-binary elements outperforms the H matrix configured with binary elements, but has a complicated Galois field operation. The binary LDPC codes has the H matrix configured with the binary elements 0 and 1, and they are classified as regular LDPC codes which have the same weights of rows of the H matrix, and irregular LDPC codes which have different weights of rows.

It is not easy to configure the H matrix since the regular LDPC codes require constant weights of the rows. It is advantageously easy for the irregular LDPC codes to configure the H matrix configured with a high girth (minimum cycle number except 4-cycle) since the irregular LDPC codes do not have constant weights of the rows in the H matrix. Also, it is widely known that the irregular LDPC codes generally outperform the regular LDPC codes, but the irregular LDPC codes increase complexity of the LDPC encoder and decoder with image information of the H matrix.

SUMMARY OF THE INVENTION

It is an advantage of the present invention to provide a method for generating the H matrix that represents performance of irregular LDPC codes by using regular LDPC codes, and an LDPC encoder using the method.

In one aspect of the present invention, an encoder using LDPC (low density parity check) codes, comprises:

a parity check matrix generator for generating a parity check matrix H; and a codeword generator for processing the parity check matrix H to generate a codeword, wherein the codeword generator comprises: an AB analyzer for analyzing the parity check matrix H into matrixes A and B; a pivoting unit for pivoting the parity check matrix H; a bit-reversing unit for bit-reversing the pivoted matrix; an LU analyzer for analyzing the matrix A into matrixes L and U; and a codeword generator unit for performing logical operation on the matrixes A, B, L and U.

The codeword generator unit comprises:

a first operator for performing a predetermined operation on the matrix B and source input information which is a vector s to find a vector z;

a second operator for performing a predetermined operation on the vector z and the matrix L to find a vector y; and a third operator for performing a predetermined operation on the vector y and the matrix U to find a codeword c.

The first operator performs a logical product operation by the length of the vector s and performs a logical sum operation to generate the vector z.

The codeword generator unit further comprises a memory for storing the matrixes A, B, L, and U.

The codeword generator unit further comprises a temporary storage unit for performing a logical operation according to the pipeline method, and storing results calculated during the logical operation process.

In one aspect of the present invention, an encoding method using LDPC (low density parity check) codes comprises:

(a) generating a parity check matrix H;

(b) permuting the matrix H into a non-singular matrix;

(c) dividing the non-singular matrix into matrixes A and B, and storing them;

(d) performing pivoting and checking execution results;

(e) analyzing the matrix A into matrixes L and U, storing them, and calculating a codeword from the matrixes A, B, L and U, when the checking result is 1; and (f) performing bit reversion, and performing the pivoting, when the checking result is not 1.

The step (e) comprises:

(i) performing a predetermined operation on the matrix B and a vector s which is source input information to find a vector z;

(ii) performing a predetermined operation on the vector z and the matrix L to find a vector y; and (iii) performing a predetermined operation on the vector y and the matrix U to find a codeword c.

The step (i) comprises performing a logical product operation by the length of the vector s to generate the vector z.

In (i), (ii), and (iii), the predetermined operation is performed according to the pipeline method.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Figure 1:
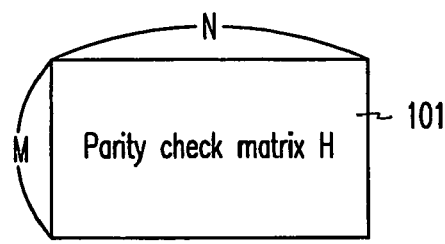
FIG. 1 shows a process for encoding LDPC codes using a parity check matrix H according to a preferred embodiment of the present invention.
Figure 1:
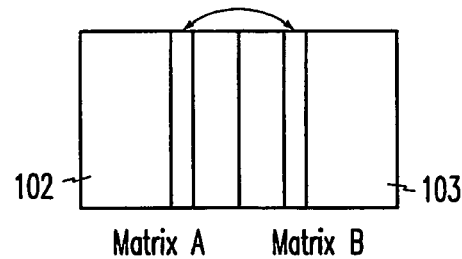
Figure 1:
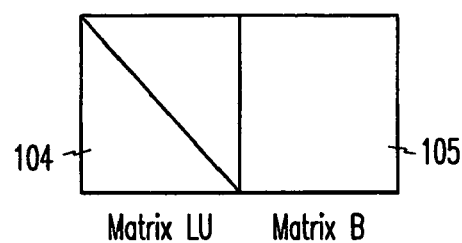
Figure 1:
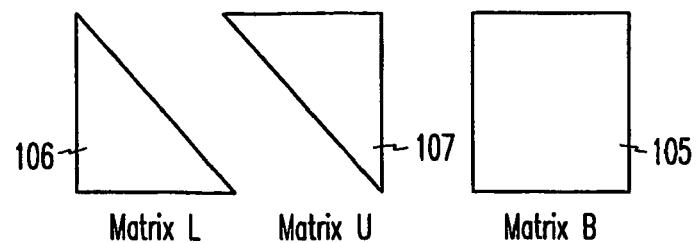

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

In general, the method for encoding LDPC codes includes a method for encoding the LDPC codes by a generator matrix G, and a method for encoding the same by a parity check matrix H.

The encoding method by the generator matrix G finds a parity check matrix H for a decoder, and converts the matrix H into a generator matrix G. The generator matrix G is found by the Gauss-Jordan elimination method, but since the process for realizing the generator matrix G in the hardwired or software manner is very irregular, it requires many operations.

Therefore, a method and device for encoding the LDPC codes using the parity check matrix H without finding the generator matrix G will be described in the preferred embodiment of the present invention.

In general, a given codeword u and an (M×N) parity check matrix H satisfy the following equation.

$$u \cdot H^T = 0 \qquad \text{Equation 1}$$

When assuming that a message bit s is provided on the right of the codeword u and a parity check bit c is provided on the left thereof, the codeword u is given as Equation 2.

$$u = [c|s] \qquad \text{Equation 2}$$

Hence, the parity check matrix H is given as Equation 3.

$$H = [A|B] \qquad \text{Equation 3}$$

where A is an (M×N) matrix, B is an {M×(N−M)} matrix, and the matrix A which is the left of the matrix H is also an identity matrix.

By Equations 2 and 3, Equation 1 is given as follows.

$$Ac + Bs = 0 \qquad \text{Equation 4}$$

Accordingly, the parity check bit c is given as below.

$$c = A^{-1}Bs \qquad \text{Equation 5}$$

where the matrix A is a non-singular matrix to calculate the parity check bit c. The two matrixes obtained by column permutation are equivalent to each other, and hence, if the matrix A is not a non-singular matrix, the original parity check bit c is found by column permutation after finding a temporary parity check bit c'.

Therefore, the non-singular matrix A is to be found so as to generate the parity check matrix H in the above-noted encoding process. However, since resources are restricted by the column permutation or row permutation, it is not always easy to find the non-singular matrix A, and when the parity check matrix H becomes greater, a generation time of the parity check matrix H becomes longer, or the corresponding generation becomes impossible.

Recently, a method for encoding the parity check matrix H when it is predefined as several sizes without generating it in real-time has been proposed. The method repeats sub-matrixes or repeatedly configures shifted sub-matrixes to thereby generate a parity check matrix appropriate to a size of input information and encode it.

In the process of repeating the sub-matrixes, the size of the matrix becomes greater, and the weights of the columns also become greater. In this instance, the increase of weights of the columns gives no influence to performance improvements of the LDPC codes. When storing the parity check matrix in a ROM (read only memory), location information on the rows and columns having weights is stored therein, and when the weights of the rows or the columns become greater or are varied according to the size of the matrix, corresponding complexity of the hardware becomes greater.

Hence, a pivoting method and a bit-reversing method for efficiently finding the non-singular matrix will now be described.

The bit-reversing method performs pivoting on bits so as to configure a non-singular matrix, and reverses the bits when the pivoting is not satisfied. When the bits are reversed, the pivoting is quickly satisfied without changing the weights of the rows and columns of the parity check matrix H for the regular LDPC codes.

In the bit-reversing method, the elements 0 of the rows and columns are reversed to 1, and the elements 1 of the rows and columns are reversed to 0. In this instance, the bits in the diagonal direction in the matrix are also reversed so as not to change the weights of the rows and columns of the parity check matrix H.

A method for generating a non-singular matrix according to a preferred embodiment of the present invention will now be described.

FIG. 1 shows a process for encoding LDPC codes using a parity check matrix H according to a preferred embodiment of the present invention.

As shown, the LDPC encoder generates a parity check matrix H 101 using a method proposed by Gallager. That is, in the (N,3,6) code having three sub-matrixes, the first sub-matrix has i rows and $\{(j-1)k+1 \sim i \cdot k\}$ columns where j is a column weight, and k is a row weight representing the number 6. The second sub-matrix permutes the first sub-matrix in the orders of block interleaving, and the third permutes the second sub-matrix in the orders of block interleaving.

The parity check matrix H 101 is configured so as to generate a codeword. For this, columns and rows are permuted in the same manner as the matrixes A and B 102 and 103 so as to configure the matrix A as a non-singular matrix when dividing the parity check matrix H into the matrixes A and B.

Next, an inverse matrix of the matrix A is found, and the inverse matrix is provided to Equation 5 to generate a codeword c by using an LU analysis method for easy hardwired realization.

The matrix A is configured such that the pivoting results may always be 1 since the configuration of a matrix for the pivoting results to satisfy 1 results in a non-singular matrix for the LU analysis. When performing LU analysis on the matrixes A and B 104 and 105, matrixes L and U 106 and 107 are found.

Figure 5:
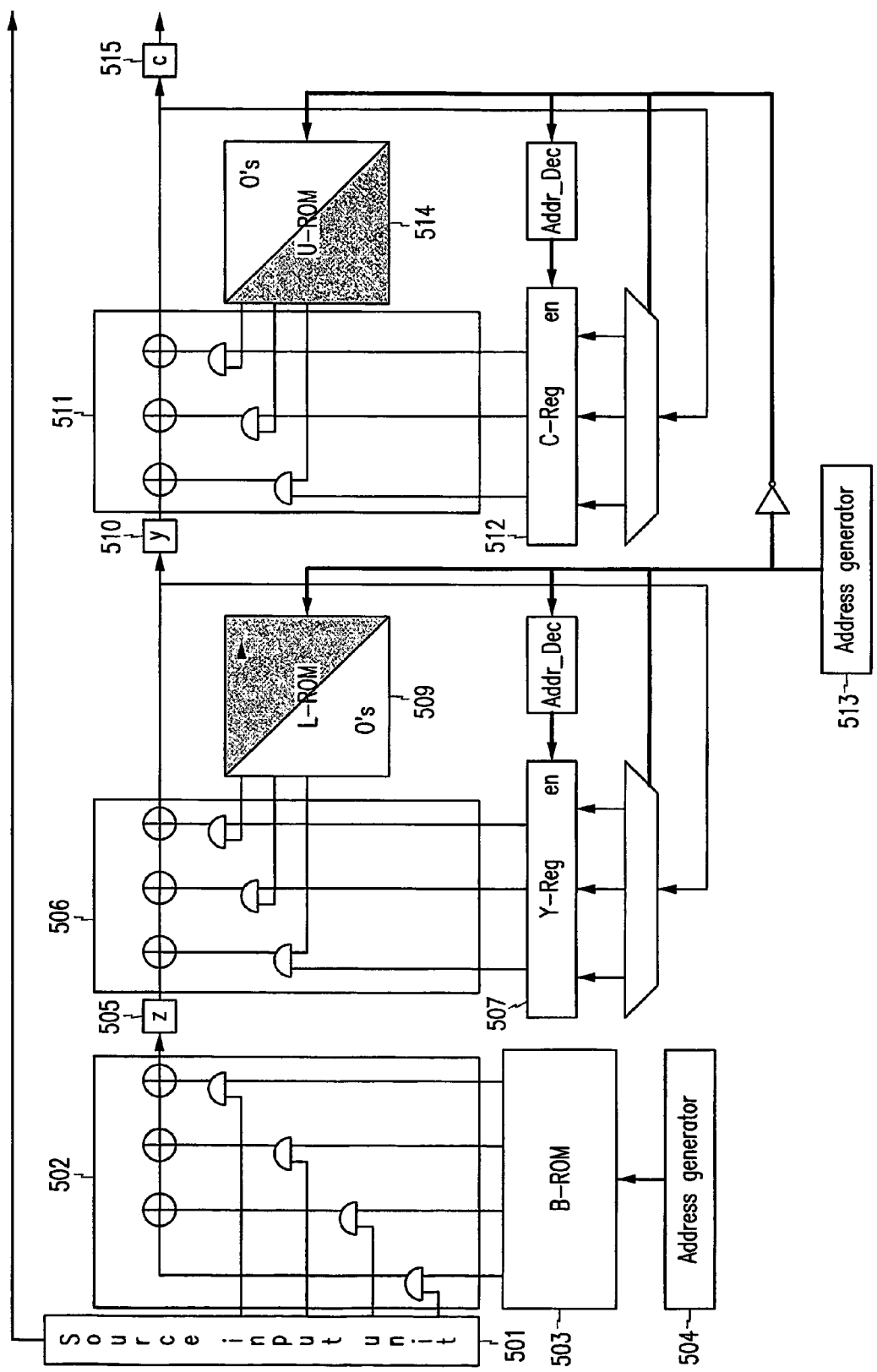
FIG. 5 shows a detailed block diagram of the codeword generator of FIG. 4.

Since the product of the matrixes L and U is the matrix A, the codeword c is obtained by forward and inverse substitution, which gives the same results as calculation results by the inverse matrix $A^{-1}$ of FIG. 5.

Orders of the generated codeword are permuted following the permuted column orders so as to find the non-singular matrix.

Since the elements of the matrix in the LU analysis are binary numbers, the inverse matrix of the matrix A is to be a binary non-singular matrix, and the matrixes L and U are to have binary elements.

In this instance, a pivoting process for performing LU analysis on the matrix A is as follows.

$$\alpha_{ii} = 1 \quad i = 1, \ldots, N$$

$$\beta_{ij} = A_{ij} - \sum_{k=1}^{i-1} \alpha_{ik}\beta_{kj}$$

$$\alpha_{ij} = \frac{1}{\beta_{ij}}\left(A_{ij} - \sum_{k=1}^{j-1} \alpha_{ik}\beta_{kj}\right)$$

Equation 6

The matrix through pivoting by Equation 6 is given below.

$$\begin{bmatrix} \beta_{11}\beta_{12}\beta_{13}\beta_{14} \\ \alpha_{21}\beta_{22}\beta_{23}\beta_{24} \\ \alpha_{31}\alpha_{32}\beta_{33}\beta_{34} \\ \alpha_{41}\alpha_{42}\alpha_{43}\beta_{44} \end{bmatrix}$$

By dividing the above matrix into the matrixes L and U, the encoding process is finished.

The pivoting results are to be 1 so as to generate a non-singular matrix, and if not, the columns are permuted to check the pivoting results. However, when the pivoting result does not become 1 after permuting the columns, that is, when no non-singular matrix is generated, the bit-reversing method is applied to effectively generate the non-singular matrix.

The bit-reversing method enables the matrix A of the matrix H to be easily configured as a non-singular matrix. The non-singular matrix is simply and effectively configured by applying the bit-reversing method when failing to perform pivoting after permuting the columns or the rows.

Figure 2:
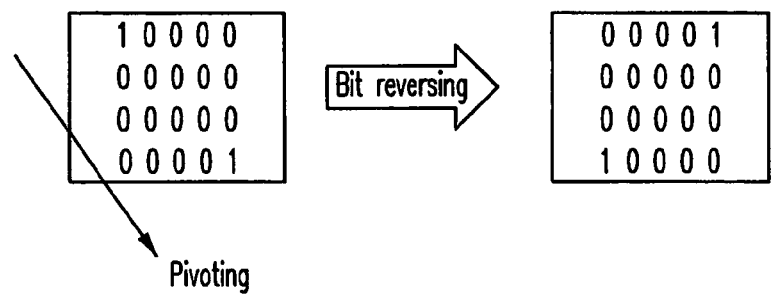
FIG. 2 shows a bit-reversing process in the encoding method according to a preferred embodiment of the present invention.

FIG. 2 shows a bit-reversing process for reversing the diagonal elements from 0 to 1 in the encoding method according to a preferred embodiment of the present invention.

As shown, the bits are reversed by checking them in the +y and +x directions with respect to locations of the diagonal elements in the orders of from close gaps between the +x and +y axes, which is effective in eliminating 4 cycles and generating the matrix H having a high girth, and which also shows similar performance to the irregular LDPC decoding performance.

To realize the encoding process of the generated parity check matrix into a hardwired circuit, it is needed to reduce memory usage by only storing locations of the rows and the columns. Also, the encoder is configured to operate according to the pipeline method appropriate to high-speed mobile communication systems.

Figure 3:
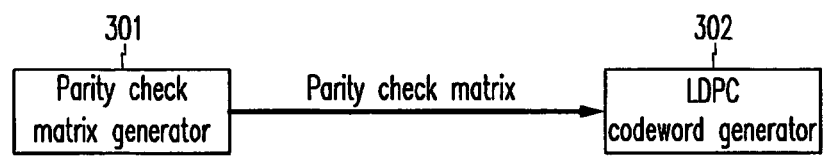
FIG. 3 shows a hardwired connection diagram for encoding the LDP codes using the parity check matrix H generated in FIG. 2.

FIG. 3 shows a hardwired connection diagram for encoding the LDP codes by using the parity check matrix H generated in FIG. 2.

As shown, the parity check matrix generator 301 generates and outputs the parity check matrix H, and the codeword generator 302 receives and encodes it.

Figure 4:
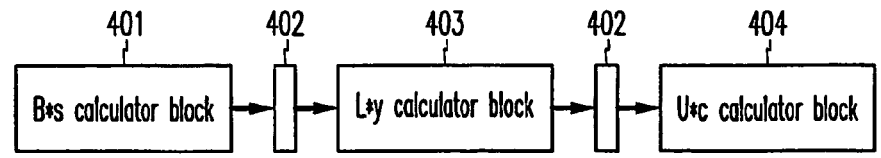
FIG. 4 shows a brief configuration block diagram of a codeword generator of FIG. 3.

FIG. 4 shows a brief configuration block diagram of the codeword generator 302 of FIG. 3.

As shown, the codeword generator 302 comprises a B·X·s calculator block 401, an L·X·y calculator block 403, and a U·X·c calculator block 404, and the calculator blocks operate according to the pipeline method. The units 402 represent double buffers for performing a temporary storage function in the pipeline process.

FIG. 5 shows a detailed block diagram of the codeword generator of FIG. 4.

As shown, the codeword generator comprises a source input unit 501; a B·X·s calculator 502; an L·X·y calculator 506; a U·X·c calculator 511; two pipeline buffers 505 and 510; an output buffer 515; three ROMs 503, 509, and 514; temporary storage units 507 and 512 for storing an intermediate value caused by substitution in each row of the matrix; and ROM address generators 504 and 513 for increasing rows of the matrix.

The B·X·s calculator 502 performs a logical product operation on the input sources provided by the source input unit 501 by the length of the source input information, and performs a logical sum operation on them to generate a vector z, and the vector z is input to the L·X·y calculator 506 through the pipeline buffer 505.

The L·X·y calculator 506 performs a logical operation on the vector z and the matrix L to generate a vector y, and the vector y is input to the U·X·c calculator 511 through the pipeline buffer 510.

The U·X·c calculator 511 performs a logical operation on the vector y and the matrix U to generate a codeword c.

As described, the calculators 502, 506, and 511 perform the same operation, and they perform the operation in a parallel scheme or share a circuit to perform time-sharing calculation, thereby improving hardwired throughputs.

Performance (data rates) of the above-configured codeword generator is determined by Equation 7.

$$\text{DataRate} = \frac{\text{clock(MHz)} \times \text{Par}}{Wr}\text{Mbps}$$

Equation 7 where Par is a parallel factor, and Wr is a weight of a row. The parallel factor has values of 16, 32, and 64, and when the parallel factor becomes greater, the complexity of its hardware also increases but improves the data rates.

Figure 6:
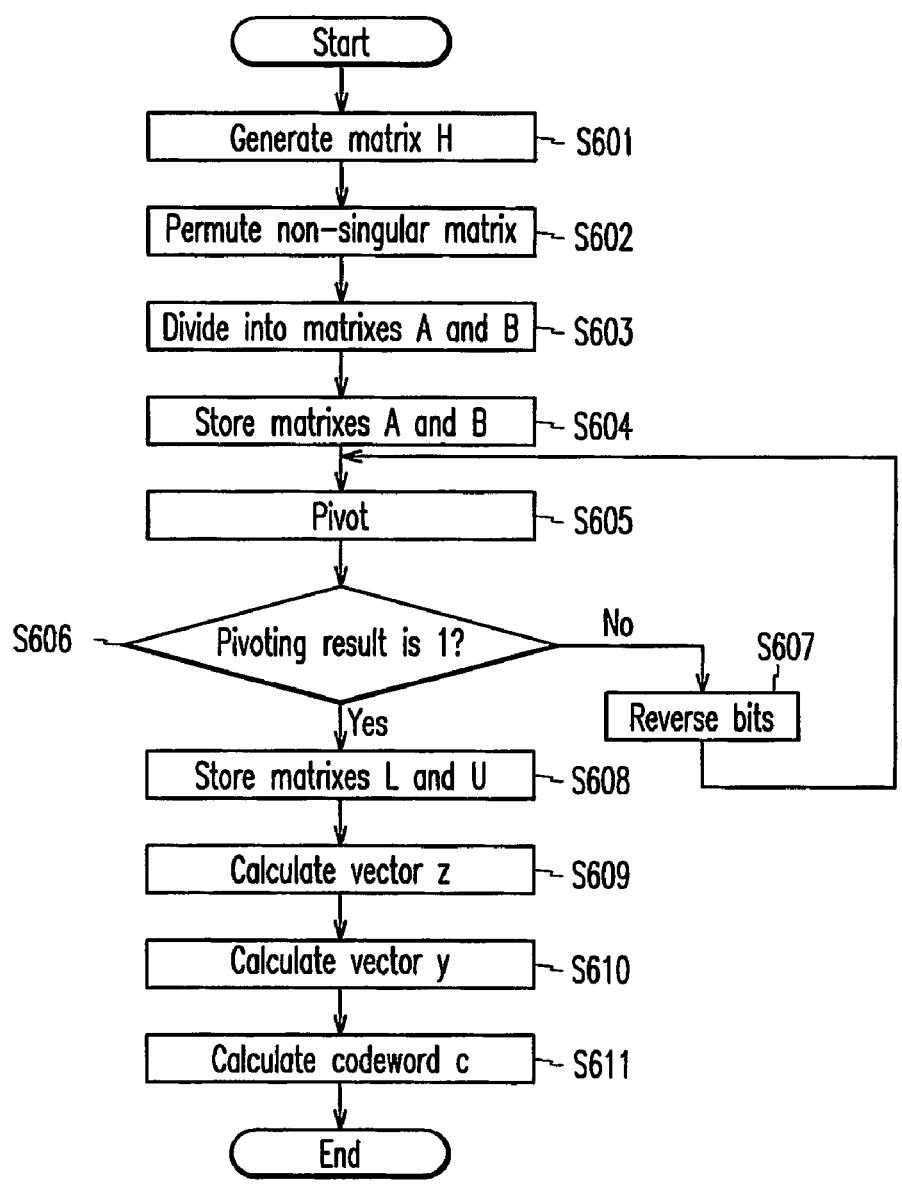
FIG. 6 shows a flowchart for an encoding process.

FIG. 6 shows a flowchart for an encoding process.

As shown, a parity check matrix H is generated and permuted into a non-singular matrix in steps S601 and S602, the non-singular matrix is divided into matrixes A and B, and the matrixes A and B are stored in a ROM in steps S603 and S604. A pivoting process is performed in step S605, and when the pivoting result is 1, the matrix A is divided by the LU analysis to store the matrixes L and U in steps S606 and S608.

When the pivoting result is not 1, the bit-reversing process is performed in step S607 to repeat the pivoting process.

The previously stored matrix B and the vector s which is the source input information are operated to find a vector z in step S609, the vector z and the stored matrix L are operated to find a vector y in step S610, and the vector y and the matrix U are operated to find a codeword c in step S611.

As described, by applying the LDPC encoding method, a parity check matrix having a high girth is generated at a high speed using a regular encoder. Therefore, an encoder having performance similar to that of the irregular LDPC codes and having less complexity is realized.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An encoder performing encoding operations using LDPC (low density parity check) codes, comprising:
    a parity check matrix generator for generating a parity check matrix H; and
    a codeword generator for processing the parity check matrix H to generate a codeword, wherein the codeword generator comprises:
        an AB analyzer for analyzing the parity check matrix H into matrixes A and B;
        a pivoting unit for pivoting the parity check matrix H comprising matrixes A and B and for checking the pivoting result being 1;
        a bit-reversing unit for bit-reversing the pivoted matrix when the pivoting result is not 1;
        an LU analyzer for analyzing the matrix A into matrixes L and U when the pivoting result is 1; and
        a codeword generator unit for performing a logical operation on the matrixes A, B, L, and U to determine parity bits when the pivoting result is one, wherein a codeword is determinable based on the parity bits.

2. The encoder of claim 1, wherein the codeword generator unit comprises:
    a first operator for performing a predetermined operation on the matrix B and source input information which is a vector s to find a vector z;
    a second operator for performing a predetermined operation on the vector z and the matrix L to find a vector y; and
    a third operator for performing a predetermined operation on the vector y and the matrix U to find the parity bits.

3. The encoder of claim 2, wherein the first operator performs a logical product operation by the length of the vectors and performs a logical sum operation to generate the vector z.

4. The encoder of claim 1, wherein the codeword generator unit further comprises a memory for storing the matrixes A, B, L and U.

5. The encoder of claim 1, wherein the codeword generator unit further comprises a temporary storage unit for performing a logical operation according to the pipeline method, and storing results calculated during the logical operation process.

6. An encoding method of encoding a data comprising a sequence of binary bits into a codeword by using LDPC (low density parity check) codes, for reliable transmission of information embodied in the data in a communication channel, the method comprising:
    (a) generating a N number of bits representing a parity check matrix H;
    (b) performing a bit level permuting of the matrix H into a non-singular matrix;
    (c) dividing the non-singular matrix into a matrix A and a matrix B, and storing the bits representing the matrixes A and B in a memory,
    (d) operating a codeword generator to perform pivoting operations on the bits representing the matrixes A and B and checking for a pivoting result being 1;
    (e) when the pivoting result of step (d) is 1. operating the codeword generator analyzing the matrix A into matrixes L and U, storing only the row and column locations of tho bits in the matrixes such that memory storage requirement is reduced, and calculating parity bits from the sequence of predetermined number of information symbols using the matrixes A, B, L, and U, wherein the codeword is determinable based on the parity bits; and
    (f) when the pivoting result of step (d) Is not 1, performing bit reversion and then sequentially repeating the steps (d)–(e) or the steps (d) and (f).

7. The encoding method of claim 6, wherein (e) comprises:
    (i) performing a predetermined operation on the matrix B and a vector s which is source input information to find a vector z;
    (ii) performing a predetermined operation on the vector z and the matrix L to find a vector y; and
    (iii) performing a predetermined operation on the vector y and the matrix U to find the parity bits.

8. The encoding method of claim 7, wherein (i) comprises: performing a logical product operation by the length of the vector s to generate the vector z.

9. The encoding method of claim 7, wherein in (i), (ii), and (iii), the predetermined operation is performed according to the pipeline method.

10. A computer readable medium useful in association with a computing device which includes a processor and a memory, the computer readable medium including computer instructions which are configured to cause the computing device to encode a predetermined number of information symbols using LDPC (low density parity check) codes by performing the acts comprising:
    (a) generating a parity check matrix H;
    (b) permuting the matrix H Into a non-singular matrix;
    (c) dividing the non-singular matrix into matrixes A and B, and storing them;
    (d) performing a pivoting operation on the non-singular matrix and then checking for the result of the pivoting operation being 1;
    (e) when the pivoting operation result is 1, analyzing the matrix A into matrixes L and U, storing them, and calculating parity bits from the matrixes A, B, L, and U, wherein a codeword is determinable based on the parity bits; and
    (f) when the pivoting result is not 1, performing a bit reversion operation, and then repeating the steps (d) and (e) or the steps (d) and (f).

11. The computer readable medium of claim 10, wherein (e) comprises:
    (i) performing a predetermined operation on the matrix B and a vector s which is source input information to find a vector z;
    (ii) performing a predetermined operation on the vector z and the matrix L to find a vector y; and
    (iii) performing a predetermined operation on the vector y and the matrix U to find the parity bits.

12. The computer readable medium of claim 11, wherein (i) comprises:
    performing a logical product operation by the length of the vector s to generate the vector z.

13. The computer readable medium of claim 11, wherein in (i), (ii), and (iii), the predetermined operation is performed according to the pipeline method.

* * * * *